(12) United States Patent
Sugiura et al.

(10) Patent No.: US 9,368,706 B2
(45) Date of Patent: Jun. 14, 2016

(54) SUBSTRATE, LIGHT-EMITTING DEVICE, ILLUMINATING LIGHT SOURCE, AND LIGHTING APPARATUS

(71) Applicant: Panasonic Corporation, Osaka (JP)

(72) Inventors: Kenji Sugiura, Osaka (JP); Hisaki Fujitani, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/328,873

(22) Filed: Jul. 11, 2014

(65) Prior Publication Data

US 2015/0021650 A1 Jan. 22, 2015

(30) Foreign Application Priority Data

Jul. 16, 2013 (JP) .................................. 2013-147321

(51) Int. Cl.
| | |
|---|---|
| *H01L 33/62* | (2010.01) |
| *H01L 33/60* | (2010.01) |
| *H05K 3/28* | (2006.01) |
| *F21K 99/00* | (2016.01) |
| *H05K 1/02* | (2006.01) |
| *H05K 1/14* | (2006.01) |

(52) U.S. Cl.
CPC ................ *H01L 33/62* (2013.01); *H01L 33/60* (2013.01); *H05K 3/28* (2013.01); *F21K 9/00* (2013.01); *H01L 2224/45144* (2013.01); *H01L 2224/4848* (2013.01); *H01L 2224/48091* (2013.01); *H01L 2224/48228* (2013.01); *H01L 2224/48465* (2013.01); *H01L 2224/73265* (2013.01); *H05K 1/0209* (2013.01); *H05K 1/0274* (2013.01); *H05K 1/142* (2013.01); *H05K 3/284* (2013.01); *H05K 2201/015* (2013.01); *H05K 2201/0162* (2013.01); *H05K 2201/093* (2013.01); *H05K 2201/10106* (2013.01); *H05K 2201/10287* (2013.01)

(58) Field of Classification Search
CPC ......................................................... H01L 33/62
See application file for complete search history.

(56) References Cited

U.S. PATENT DOCUMENTS

| | | | |
|---|---|---|---|
| 6,489,637 | B1 | 12/2002 | Sakamoto et al. |
| 6,548,832 | B1 | 4/2003 | Sakamoto et al. |
| 6,730,933 | B1 | 5/2004 | Shimizu et al. |

(Continued)

FOREIGN PATENT DOCUMENTS

| | | |
|---|---|---|
| JP | 2000-353826 | 12/2000 |
| JP | 2000-353827 | 12/2000 |

(Continued)

*Primary Examiner* — Eugene Lee
(74) *Attorney, Agent, or Firm* — Greenblum & Bernstein, P.L.C.

(57) ABSTRACT

A lighting apparatus includes a substrate and a semiconductor light-emitting element mounted on the substrate. The substrate includes a plate-like base member and a copper foil layer formed on part of the base member. The substrate includes a first area and a second area. The first area is an area that is provided so as to surround an element mounting area where a semiconductor light-emitting element is mounted thereon when viewed from the top of the substrate and does not include with the copper foil layer. The second area is an area that includes a part provided so as to surround the first area and the element mounting area; and where the copper foil layer formed. The substrate has a white resist layer disposed thereon that covers the first and second areas and is formed thicker on the first area than on the second area.

12 Claims, 13 Drawing Sheets

(56) References Cited

U.S. PATENT DOCUMENTS

| | | | |
|---|---|---|---|
| 8,643,047 B2* | 2/2014 | Uemura et al. | 257/98 |
| 8,742,432 B2* | 6/2014 | Sato et al. | 257/87 |
| 9,089,050 B2* | 7/2015 | Kajiya | |
| 2008/0128739 A1* | 6/2008 | Sanpei et al. | 257/99 |
| 2009/0141492 A1* | 6/2009 | Fujino et al. | 362/249.02 |
| 2011/0309379 A1* | 12/2011 | Shibusawa et al. | 257/88 |
| 2011/0309381 A1* | 12/2011 | Betsuda et al. | 257/88 |
| 2014/0218908 A1* | 8/2014 | Kawashima et al. | 362/223 |

FOREIGN PATENT DOCUMENTS

| | | |
|---|---|---|
| JP | 2009-260396 | 11/2009 |
| JP | 2011-176017 | 9/2011 |

* cited by examiner

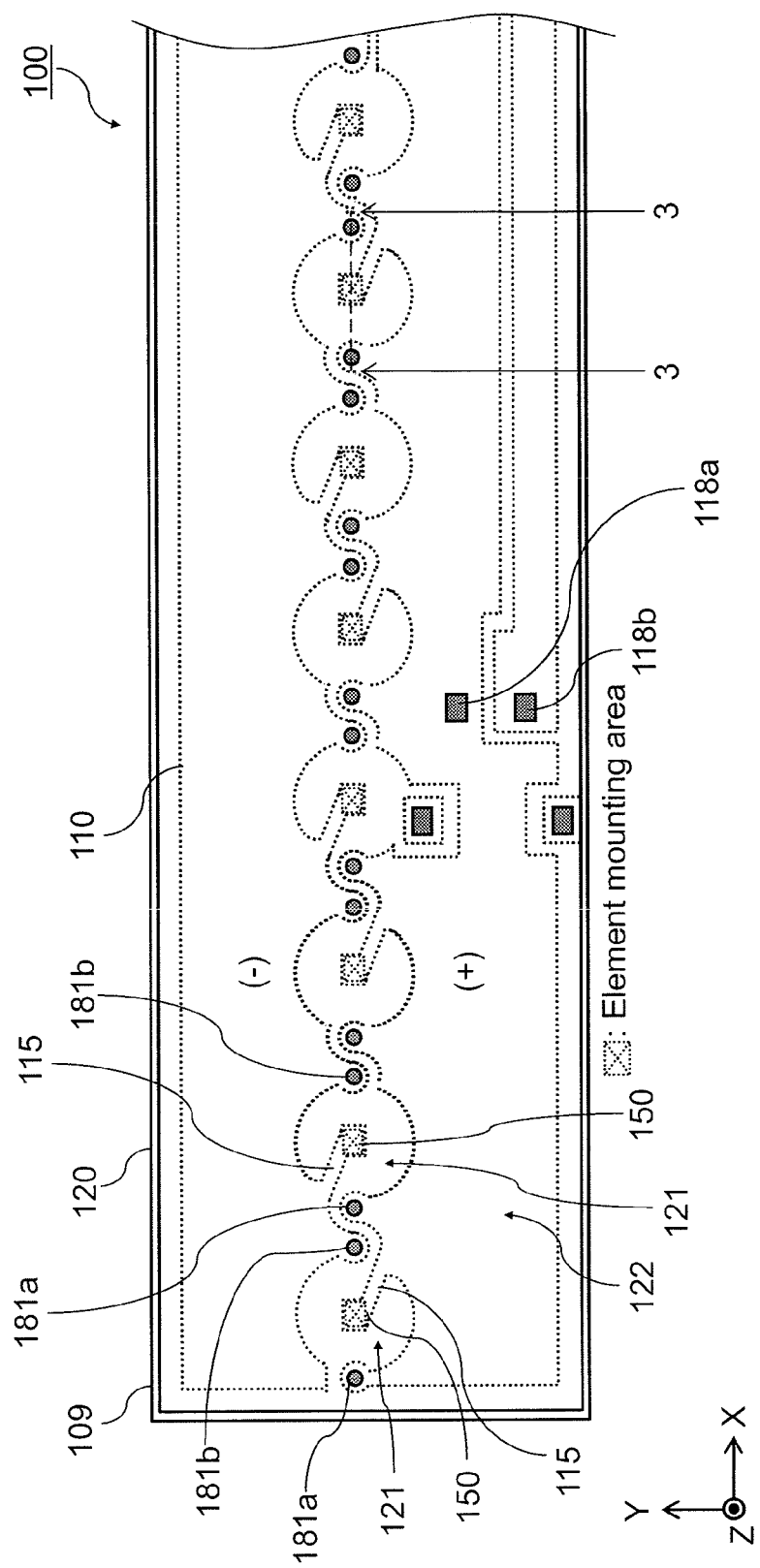

SUBSTRATE, LIGHT-EMITTING DEVICE, ILLUMINATING LIGHT SOURCE, AND LIGHTING APPARATUS

BACKGROUND OF THE INVENTION

1. Field of the Invention

This disclosure relates to a substrate, a light-emitting device, an illuminating light source, and a lighting apparatus, and more particularly to a substrate with a semiconductor light-emitting element mounted thereon, a light-emitting device using a semiconductor light-emitting element, and an illuminating light source and lighting apparatus including these components.

2. Background Art

In recent years, semiconductor light-emitting elements such as light emitting diodes (LED) have been widely used for various types of devices as highly efficient, space-saving light sources. A semiconductor light-emitting element is used as a backlight light source in a liquid crystal display device, and an illuminating light source for a lighting apparatus such a base light and a straight-tube LED lamp.

Some LEDs are incorporated into various types of devices as a light-emitting device in a unitized form. Examples of such a light-emitting device include a chip-on-board (COB) light-emitting device that has an LED chip mounted on its substrate, which is disclosed in the related arts. One example disclosed is a light-emitting device that has an element row composed of linearly arranged LEDs on the substrate and a linear resin containing fluorescent substance that collectively seals the LEDs (the element row).

SUMMARY OF THE INVENTION

A light-emitting device in the various embodiments includes a substrate and semiconductor light-emitting elements mounted on the substrate. The substrate includes a plate-like base member and a copper foil layer formed on part of the base member. The area that is provided so as to surround the element-mounted area (where the semiconductor light-emitting elements are mounted) in a top view and does not included the copper foil layer is to be a first area. The area that includes a part provided so as to surround the first area and the element-mounted area in a top view; and where the copper foil layer is formed is to be a second area. The substrate has a white resist layer that covers the first area and the second area and is formed thicker over the first area than over the second area.

This structure increases the light extraction efficiency of a light-emitting device.

BRIEF DESCRIPTION OF DRAWINGS

FIG. 1 is a top view illustrating the structural overview of a substrate according to the embodiment.

DETAILED DESCRIPTION OF THE INVENTION EMBODIMENT

Figure 2A:
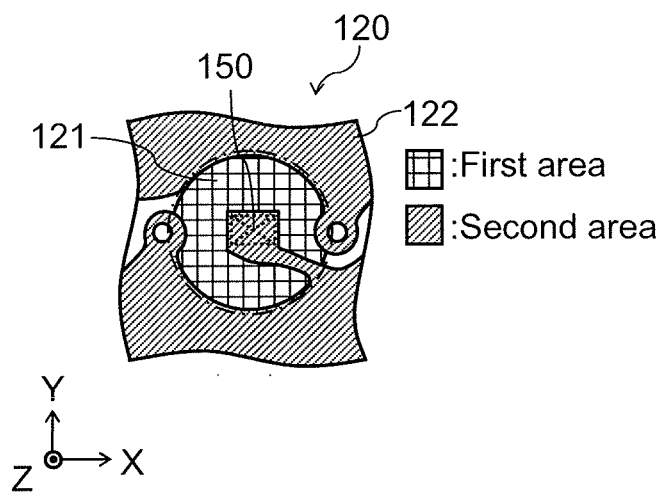
FIG. 2A is a top view illustrating part of the resist layer in the substrate shown in FIG. 1.

Prior to the description of the embodiment, some disadvantages are described of existing light-emitting devices. A light-emitting device is demanded for increasing the light extraction efficiency. For a substrate made of resin with LEDs mounted thereon for instance, the main surface (on which LEDs are mounted) preferably has a higher light reflectance.

An LED decreases its luminous efficiency due to the self-generated heat. To increase the light extraction efficiency of an LED, increasing the heat discharge characteristics of the light-emitting device is required as well.

To sum up, a substrate used for a light-emitting device is demanded for both high light reflection characteristics and high heat discharge characteristics.

However, to increase the light reflectance of a substrate for instance, when the light reflection layer is formed thick on the main surface of the substrate, the LEDs mounted on the light reflection layer decrease their heat discharge characteristics. To sum up, high light reflection characteristics are typically incompatible with high heat discharge characteristics.

One aspect of the light-emitting device according to the disclosure includes a substrate and a semiconductor light-emitting element mounted on the substrate. The substrate includes a plate-like base member and a copper foil layer formed on part of the base member. The area that is provided so as to surround the element-mounted area (where the semiconductor light-emitting elements are mounted) in a top view and that does not include the copper foil layer is to be a first area. The area that includes a part provided so as to surround the first area and the element-mounted area in a top view; and where the copper foil layer is formed is to be a second area.

The substrate has a white resist layer that covers the first area and the second area and is formed thicker over the first area than over the second area.

Hereinafter, a description is made of the embodiment of the disclosure with reference to the related drawings. Each drawing is schematic, not necessarily accurate. In each drawing, a substantially identical component is given the same reference mark, and a duplicate description is omitted or simplified.

The following embodiment describes comprehensive or concrete examples. They present examples of aspects such as numeric values, shapes, materials, components, positions of components, and connection forms of components, and have no gist of limiting the scope of the disclosure.

[Substrate]

FIG. 1 is a top view illustrating the structural overview of substrate 100 according to the embodiment. FIG. 1 shows part of substrate 100 as a top view to clarify the features of substrate 100.

The rectangular coordinate system indicated by X, Y, and Z in the respective drawings including FIG. 1 is used in consideration of convenience for description, and does not limit the absolute posture of substrate 100 and other components.

For example, a top view of substrate 100 refers to a case of substrate 100 viewed from the surface on which LEDs are mounted. In this description, it refers to a case of substrate 100 viewed from the positive direction of the Z axis. Similarly, a top view of a component refers to a case of the component viewed from the positive direction of the Z axis. Further, the Z axis as a reference for these cases is not limited to a specific direction (e.g., vertical direction, horizontal direction).

Substrate 100, on which LEDs are to be mounted, includes plate-like base member 109, copper foil layer 110 formed on base member 109 in a given shape, and resist layer 120 so as to cover copper foil layer 110. Copper foil layer 110 is formed on part of base member 109.

Substrate 100 is capable of mounting multiple LEDs in a linear arrangement. Concretely, each LED is mounted in element mounting area 150 (an area on which one LED is to be mounted) of substrate 100.

Resist layer 120 is a coat of white resist made of a white resin material as a raw material, and characteristically includes first area 121 and second area 122, which are described later in reference to FIG. 2A through FIG. 3.

Hereinafter, a description is made of each element of substrate 100 basically having such a structure.

[Base Member]

Base member 109 is a rectangular, ruler-like plate member. The aspect ratio L1/L2 of base member 109 is preferably $L1/L2 \geq 10$, where L1 is the longitudinal (X-axis direction or the long side) length, and L2 is the lateral (Y-axis direction or the short side) length.

For example, base member 109 of L1=280 mm, L2=15 mm (aspect ratio: 18.67), and thickness=1.0 mm can be used.

Base member 109 uses a nontransparent resin as the matrix. Base member 109 is a plate-like member composed of epoxy resin and glass fiber (e.g. a glass composite material) for instance.

A substrate made of a glass composite material is called glass nonwoven fabric base member epoxy resin copper-clad laminate (composite epoxy material-3 (CEM-3)). Substrate 100 can be made of CEM-3.

[Copper Foil Layer]

Copper foil layer 110 is a metal layer that functions as wiring for supplying power to LEDs mounted on substrate 100, formed on the surface of base member 109 in a given shape.

On substrate 100 including such copper foil layer 110, various types of electrode terminals are formed on a part where resist layer 120 is not provided (i.e., a part where copper foil layer 110 is exposed, dotted parts in FIG. 1).

Concretely, substrate 100 includes wire connection parts 181a and 181b with element mounting area 150 interposed therebetween; and electrode terminals 118a and 118b receiving power from the outside.

Electrode terminal 118a is a positive electrode terminal, connected with each of multiple wire connection parts 181a. Electrode terminal 118b is a negative electrode terminal, connected with each of multiple wire connection parts 181b.

Wire connection part 181a is a part electrically connected to the positive electrode of an LED. Wire connection part 181b is a part electrically connected to the negative electrode of an LED. An LED connected to wire connection parts 181a and 181b emits light on power supplied from electrode terminals 118a and 118b.

Copper foil layer 110 also functions as a component for increasing the heat discharge characteristics of LEDs mounted on substrate 100.

On substrate 100, LEDs are connected in parallel by means of copper foil layer 110. However, changing the pattern of copper foil layer 110 allows LEDs to be connected in series. An example pattern of copper foil layer 110 that connects multiple LEDs in series is described later in reference to FIG. 10.

Note that in FIG. 1 parts (dotted rectangular areas) where copper foil layer 110 is exposed are present also to the left of electrode terminals 118a and 118b. These areas are used for attaching connectors (not shown) connected to electrode terminals 118a and 118b.

On base member 109, first area 121 is present that is provided so as to surround element mounting area 150 where LED 30 (refer to FIG. 3) is mounted in a top view; and where copper foil layer 110 is not formed. Similarly, second area 122 is present that includes a part provided so as to surround first area 121 and element mounting area 150 in a top view; and where copper foil layer 110 is formed. This produces a thickness difference between first area 121 and second area 122 of resist layer 120 (described later).

[Resist Layer]

Resist layer 120 is an insulating film formed so as to cover copper foil layer 110, made of a coat of white resist as described above.

This white resist is a material made of an epoxy resin as a matrix that contains light-reflective particles (e.g., titanium oxide particles). Covering the surface of substrate 100 where LEDs are mounted with a white resist provides substrate 100 with a high light reflectance.

After all, resist layer 120 functions as both an insulating film covering copper foil layer 110 and a light reflective film for light from LEDs.

In other words, resist layer 120 is a component that enhances the light extraction efficiency (an increase of luminous fluxes) of a light-emitting device using substrate 100.

Note that a material of a white resist used for resist layer 120 is not especially limited. Resist layer 120 may be formed of a white resist made of a fluorine resin or silicone as a matrix for instance.

Further, resist layer 120 has first area 121 and second area 122 with thicknesses different from each other as described above.

Hereinafter, a description is made of features of substrate 100, such as the thickness difference between the areas of resist layer 120 and its advantages using FIGS. 2A through 4B.

Figure 2B:
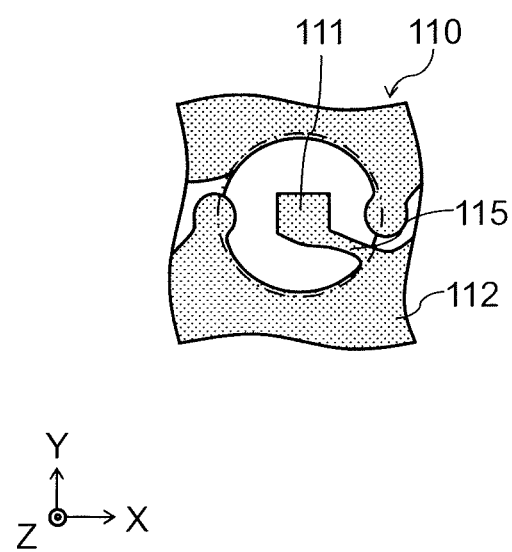
FIG. 2B is a top view illustrating part of the copper foil layer in the substrate shown in FIG. 1.

FIG. 2A is a top view illustrating part of resist layer 120 near element mounting area 150 of substrate 100. Similarly, FIG. 2B is a top view illustrating part of copper foil layer 110 near element mounting area 150, namely a top view before resist layer 120 is formed.

Figure 3:
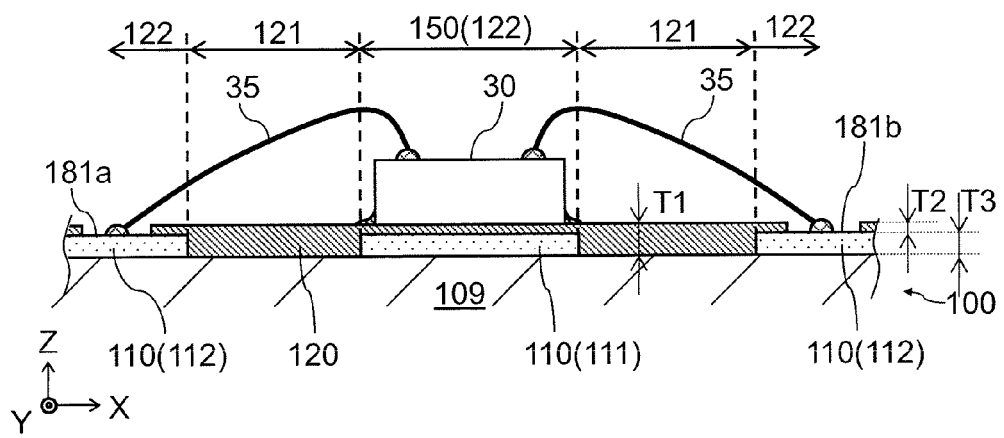
FIG. 3 is a sectional view illustrating a cross-sectional overview of the substrate in FIG. 1, taken along line 3-3.

FIG. 3 is a sectional view illustrating the overview of the cross section of substrate 100 in FIG. 1, taken along line 3-3. Note that FIG. 3 illustrates the overview of the cross section of substrate 100 in a state where LED 30 is mounted in one element mounting area 150. LED 30 is shown not by its cross section but by its rectangular side surface in a simplified way.

As shown in FIG. 2A, resist layer 120, which is first area 121 provided so as to surround element mounting area 150, covers first area 121 where copper foil layer 110 of base member 109 is not provided.

Resist layer 120 covers second area 122 including a part provided so as to surround first area 121 and element mounting area 150; and where copper foil layer 110 is provided.

Note that element mounting area 150 is an area other than first area 121, where copper foil layer 110 is formed, and is part of second area 122, namely included in second area 122.

As shown in FIG. 2B, copper foil layer 110 has first part 111 positioned underneath element mounting area 150; and second part 112 positioned outside first area 121 in a top view.

Copper foil layer 110 preferably has connection part 115 that connects first part 111 with second part 112. More specifically, copper foil layer 110 in second area 122 preferably has connection part 115 that connects the part positioned in element mounting area 150 with the part positioned outside first area 121.

Note that each dashed-dotted line in FIGS. 2A and 2B indicates a circle circumscribing first area 121.

In this way, base member 109 is provided thereon with an area where copper foil layer 110 is not provided in the area surrounding element mounting area 150 (i.e., the area between first part 111 and second part 112). Connection part 115 is disposed so as to lie across this area.

This connection part 115 causes heat generated by LED 30 mounted in element mounting area 150 to conduct from first part 111 toward second part 112. Consequently, entire copper foil layer 110 (refer to FIG. 1) that has a relatively large surface area on base member 109 is effectively used for discharging heat from LED 30.

Meanwhile, as shown in FIG. 1, connection part 115 is provided correspondingly to each element mounting area 150. In other words, substrate 100 is a substrate on which LEDs 30 are mounted linearly. Resist layer 120 covers multiple element mounting areas 150 and multiple first areas 121 both provided correspondingly to multiple LEDs 30. Copper foil layer 110 has multiple connection parts 115 corresponding to multiple element mounting areas 150.

Accordingly, respective connection parts 115 contribute to discharging heat generated by respective LEDs 30 mounted on substrate 100.

Resist layer 12 has a thickness on first area 121 where copper foil layer 110 is not formed larger than on second area 122. In other words, white resist layer 120 covers first area 121 and second area 122 and is formed thicker on first area 121 than on second area 122.

Concretely, as shown in FIG. 3, assumption is made of a case where T1 is the thickness of resist layer 120 in first area 121; T2, in second area 122; and T3, the thickness of copper foil layer 110.

In this case, T3 is 35 μm; T2, 20 μm; and T1, 55 μm, for instance.

First area 121 where resist layer 120 is thicker provides a higher light reflectance, which enhances the light extraction efficiency of light emitted by LED 30. A description is made later of relationship between the thickness of resist layer 120 and the light reflectance in reference to FIG. 4A.

Note that resist layer 120 having different thicknesses in between first area 121 and second area 122 is formed by screen printing for instance.

Concretely, a mask is set onto base member 109 on which copper foil layer 110 is formed. Then, a white resist is press-spread over the mask with a squeegee and dried. This forms resist layer 120 with its surface flattened so as to cover copper foil layer 110.

Consequently, as shown in FIG. 3 for instance, resist layer 120 is formed thicker in a part where copper foil layer 110 is not provided; thinner, where copper foil layer 110 is provided.

After all, first area 121 where copper foil layer 110 is not formed on base member 109 functions as an area (resist storage area) for storing the white resist, which causes the thickness of resist layer 120 to be larger in first area 121.

Further, copper foil layer 110 may have multiple connection parts 115 corresponding to respective element mounting areas 150, and respective connection parts 115 may be provided in a direction nonorthogonal (in a top view) to the direction in which element mounting areas 150 are arranged (refer to FIG. 1). In other words, it is preferable that the following conditions are satisfied. That is, multiple element mounting areas 150 are arranged linearly; multiple first areas 121 and multiple connection parts 115 are provided each corresponding to multiple element mounting areas 150; and respective connection parts 115 extend in a direction nonorthogonal (in a top view) to the direction in which element mounting areas 150 are arranged.

Accordingly, as described above, when the white resist is press-spread over base member 109 with a squeegee, respective connection parts 115 is not likely to block the white resist spreading over base member 109. This allows the white resist to be applied without forming any clearance along both base member 109 and copper foil layer 110, which for instance further increases the uniformity in the thickness of resist layer 120 in first area 121.

Note that the direction in which element mounting areas 150 are arranged agrees with the longitudinal direction of substrate 100 (base member 109), but do not need to.

LED 30 is mounted in element mounting area 150, which is part of second area 122 formed where copper foil layer 110 is formed. In other words, LED 30 is mounted in an area where copper foil layer 110 is provided and at the same time resist layer 120 is formed thin. Accordingly, resist layer 120 is less likely to affect the heat discharge characteristics. In element mounting area 150, substrate 100 has higher heat discharge characteristics than for a thicker resist layer 120 (e.g., the thickness of resist layer 120 in the first area).

Note that LED 30, an example of a semiconductor light-emitting element, is a bare chip that emits single-color visible light. LED 30 is die-bonded to substrate 100 with a die attach material (die bonding material).

Concretely, LED 30 is a blue color LED chip that emits blue color light when energized. The blue color light is converted to yellow light for instance by light wavelength converters (described later). Examples of this blue color LED chip include a gallium-nitride-based semiconductor light-emitting element that is formed of an InGaN-based material for instance and emits light with a center wavelength between 440 nm and 470 nm.

As shown in FIG. 3, LED 30 is electrically connected to wire connection parts 181a and 181b with gold wire 35. In other words, the top surface of the chip of LED 30 has a p-side electrode and an n-side electrode for supplying a current. The p-side electrode is wire-bonded to wire connection part 181*a* with gold wire 35; the n-side electrode is wire-bonded to wire connection part 181*b* with gold wire 35.

Figure 4A:
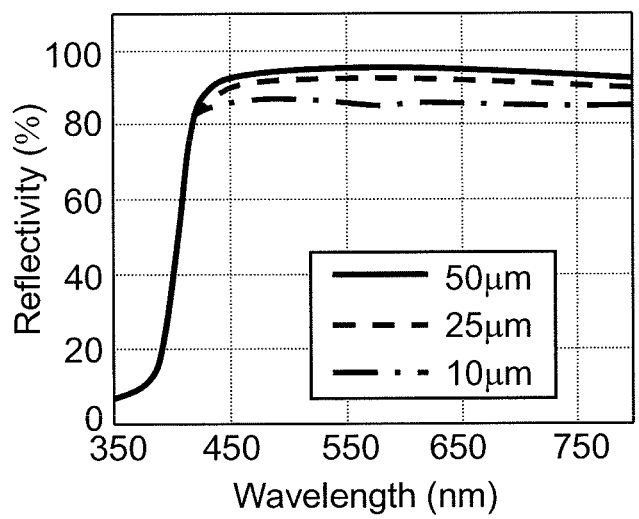
FIG. 4A shows an example of light reflectivities measured for some resist layers with different thicknesses.

Next, a description is made of the difference in light reflectivity depending on the thickness of resist layer 120 in reference to FIG. 4A.

FIG. 4A shows an example of measurement results of light reflectivities of resist layer 120 with different thicknesses formed on copper foil layer 110.

Note that the white resist used for this measurement forming resist layer 120 is made of an epoxy resin as a matrix that contains light-reflective particles (e.g., titanium oxide particles). As base member 109, a plate-like member is used composed of the above-described epoxy resin and glass fiber. Copper foil layer 110 under resist layer 120 has a thickness of 35 μm. The horizontal axis of the graph of FIG. 4A represents light wavelength As shown in FIG. 4A, the light reflectivity increases with the thickness of resist layer 120 above a light wavelength of approximately 420 nm.

This is because the light reflection at resist layer 120 includes not only the light reflection on the surface (that light enters) of resist layer 120, but reflection caused by light reflection particles that have entered the inside of resist layer 120. In other words, the amount of light reflected inside resist layer 120 increases with the thickness of resist layer 120, thereby increasing the light reflectivity.

First area 121 has a thickness of resist layer 120 relatively larger than the second area. Further, first area 121 is formed on base member 109 where copper foil layer 110 is not formed. This suppresses the decrease in the light reflectivity due to light absorption by copper foil layer 110.

Figure 4B:
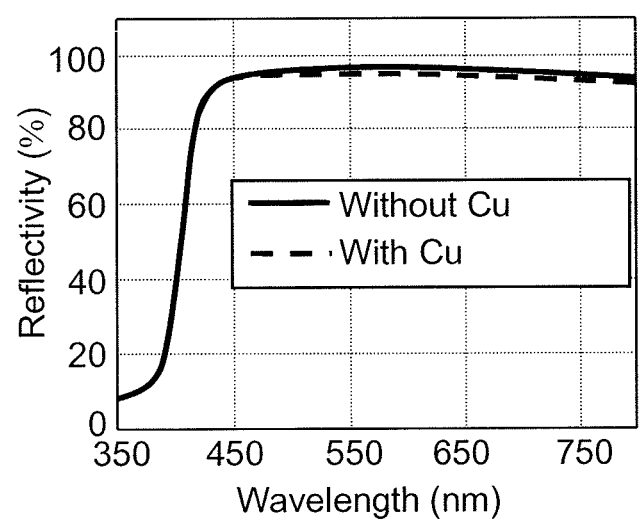
FIG. 4B shows an example of light reflectivities measured for two cases: a copper foil layer is provided under the resist layer and not provided.

FIG. 4B shows an example of light reflectivities measured for two cases: a copper foil layer is provided under the resist layer and not provided.

Note that the resist layer and the base member used for the measurement are formed of the same materials as resist layer 120 and base member 109 used for the measurement in FIG. 4A, where the thickness of the resist layers is 50 μm.

As shown in FIG. 4B, above a light wavelength of approximately 450 nm, the light reflectivity is slightly higher when a copper foil layer is not provided than when it is provided. This is supposedly because part of light that has transmitted through the resist layer is absorbed into the copper foil layer to influence the light reflectance. Further, the base member absorbs light less (i.e., higher light reflectance) than the copper foil layer, which has supposedly produced the above measurement results.

In other words, resist layer 120 has a relatively large thickness in first area 121 provided so as to surround element mounting area 150. Besides, copper foil layer 110 is not formed under first area 121.

This causes most of light from LED 30 mounted in element mounting area 150 toward first area 121 is reflected at resist layer 120 and radiated toward the outside, which enhances the light extraction efficiency.

Resist layer 120 is part of second area 122 in element mounting area 150 and is formed relatively thin (refer to FIG. 3). Accordingly, heat generated in LED 30 is influenced by resist layer 120 to a minimum extent and is conducted to a part (first part 111) of copper foil layer 110 directly below LED 30. This increases the heat discharge characteristics of substrate 100 against heat from LED 30 and also enhances the light extraction efficiency.

Figure 5A:
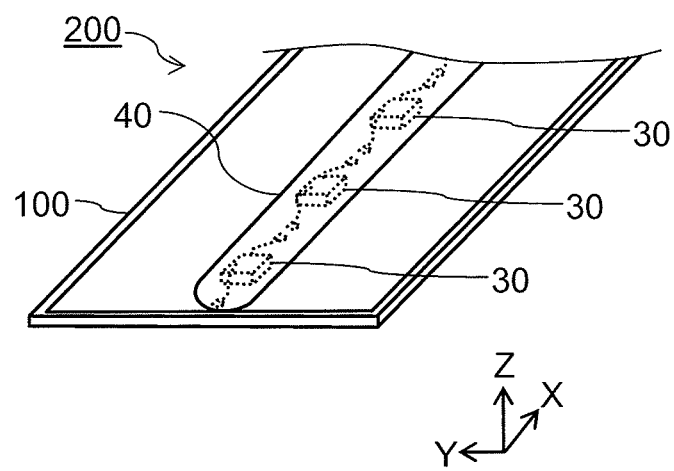
FIG. 5A is a perspective view of the end of a light-emitting device according to the embodiment.
Figure 5B:
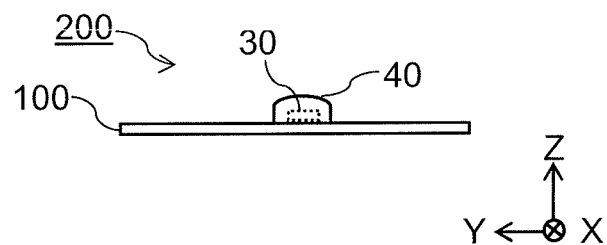
FIG. 5B is a side view of the light-emitting device according to the embodiment.

Next, a description is made of an example of a light-emitting device using substrate 100 in reference to FIGS. 5A and 5B.

[Light-Emitting Device]

FIGS. 5A and 5B illustrate the structural overview of light-emitting device 200 according to the embodiment. Concretely, FIG. 5A is a perspective view of the end of light-emitting device 200; FIG. 5B is a side view of light-emitting device 200.

As shown in FIGS. 5A and 5B, light-emitting device 200 includes substrate 100 (refer to FIG. 1); and LED 30 mounted on substrate 100.

Substrate 100 includes plate-like base member 109; and copper foil layer 110 formed on part of base member 109. Substrate 100 is provided so as to surround element mounting area 150 (refer to FIG. 1) on which LED 30 is mounted in a top view. Substrate 100 includes first area 121 where copper foil layer 110 is not provided; and second area 122 that includes an area provided so as to surround first area 121 and element mounting area 150 in a top view and where copper foil layer 110 is formed. Substrate 100 has a white resist layer that covers first area 121 and second area 122 and is formed thicker over first area 121 than over second area 122.

In substrate 100 of light-emitting device 200, copper foil layer 110 in second area 122 may include connection part 115 that connects the part positioned in element mounting area 150 to the part positioned outside first area 121.

LEDs 30 are mounted in respective element mounting areas 150 of substrate 100.

LEDs 30 linearly arranged are collectively sealed with sealing material 40 containing light wavelength converters. In other words, sealing material 40 is formed linearly in the direction (arrangement direction of LEDs 30) in which the LED elements are arranged so as to collectively seal LEDs 30 (LED element row). Connection parts 115 may be also collectively sealed with sealing material 40.

Further, sealing material 40 contains a fluorescent substance as light wavelength converters as described above. Sealing material 40 not only seals LED 30 to protect LED 30 but converts (color conversion) the wavelength of light from LED 30 to a given one.

Sealing material 40 is formed to near both longitudinal ends of substrate 100. Besides, the cross-section shape of sealing material 40 in the lateral direction of substrate 100 is substantially semicircular. Gold wires 35 (refer to FIG. 3) connected to respective LEDs 30 are also sealed, resulting in sealing material 40 functioning as an insulating material for protecting gold wire 35.

Examples of the material of sealing material 40 include an insulative resin material containing fluorescent particles. When LED 30 is a blue color LED chip for instance, fluorescent particles may be those that wavelength-convert blue color light to yellow so that sealing material 40 emits white light.

Fluorescent particles may be yellow fluorescent particles based on yttrium aluminum garnet (YAG). Resultingly, part of blue color light emitted from LED 30 is wavelength-converted to yellow light by yellow fluorescent particles contained in sealing material 40.

In other words, the yellow fluorescent particles are excited by blue color light to cause fluorescence emission. Then, the blue color light that has not been absorbed (wavelength converted) in yellow fluorescent particles; and the yellow light that has been wavelength-converted by the yellow fluorescent particles are diffused and mixed in sealing material 40 and emitted as white light from sealing material 40. Note that sealing material 40 may further contain a light diffusion material such as silica.

Sealing material 40 is a resin containing a fluorescent substance that is produced by uniformly dispersing yellow fluorescent particles into a silicone resin. Sealing material 40 can be formed using a dispenser.

For example, the discharge nozzles of a dispenser are placed opposing each other at given positions on substrate 100. Then, while the discharge nozzles are discharging a resin material (resin containing a fluorescent substance), the nozzles are moved in the direction of the element arrangement (longitudinal direction of the substrate). This way allows the resin material to be applied linearly. Note that after the resin material is applied, it is hardened by a given way, thereby forming sealing material 40.

In this way, light-emitting device 200 that emits white light can be produced.

Meanwhile, the light that has been mixed inside sealing material 40 is reflected highly efficiently on first area 121 provided so as to surround LED 30. Consequently, the mixed light is radiated outside sealing material 40 efficiently.

After all, light-emitting device 200 has high light extraction characteristics.

Note that entire resist layer 120 in first area 121 does not need to be covered with sealing material 40 in a top view. Resist layer 120 functions as a material that reflects light radiated from sealing material 40, at the part positioned outside sealing material 40 in first area 121.

The pattern (layout of copper foil layer 110) of copper foil layer 110 is not limited to that shown in FIG. 1, but a variety of patterns can be used. Hereinafter, a description is made of various types of modified examples of copper foil layer 110, centering on differences from substrate 100 in reference to FIGS. 7 through 13.

Note that each substrate in the respective modified examples described hereinafter can be used for a substrate on which multiple LEDs 30 are mounted, instead of substrate 100 in above-described light-emitting device 200.

MODIFIED EXAMPLE 1 OF SUBSTRATE

Figure 6:
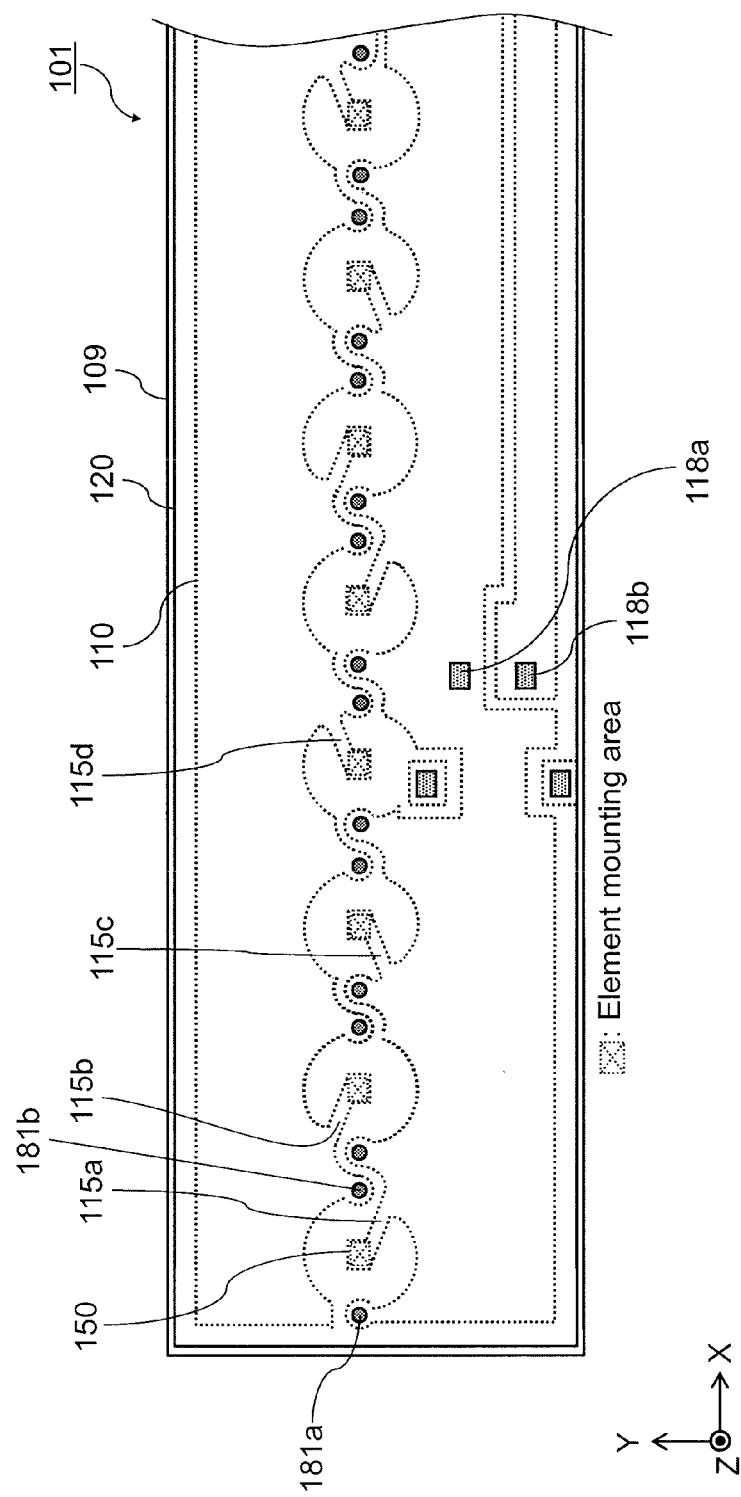
FIG. 6 is a top view illustrating the structural overview of a substrate according to modified example 1 of the substrate in FIG. 1.

FIG. 6 is a top view illustrating the structural overview of substrate 101 according to modified example 1 of substrate 100.

A description is made of influence of the orientation of connection parts 115 in substrates 100 and 101 on the light distribution characteristics. Substrate 100 shown in FIG. 1 is different from substrate 101 shown in FIG. 6 in the regularity of the orientation of connection parts 115 in a top view. The orientation of connection part 115 refers to the direction in which connection part 115 extends from first part 111 to the second with element mounting area 150 being a starting point in a top view.

The regularity of the orientation of multiple connection parts 115 refers to the number of times by which the orientation (i.e., posture) of connection parts 115 is repeated for instance. When multiple connection parts 115 are successively observed for instance, if connection parts 115 in the same orientation are present for every four parts, the regularity is 4. A larger value means a lower regularity. If the orientation of all connection parts 115 is the same, the regularity is 1. This situation is the same in other modified examples.

As shown in FIG. 1, substrate 100 has some pairs of connection parts 115: one extending to the lower right and the other to the upper left with each element mounting area 150 being a starting point, the pairs arranged successively in the longitudinal direction of substrate 100. In this case, multiple connection parts 115 of substrate 100 has a regularity of 2.

Meanwhile, as shown in FIG. 6, substrate 101 has some sets of four connection parts 115: connection part 115$a$ extending to the lower right, 115$b$ to the upper left, 115$c$ to the lower left, and 115$d$ to the upper right with each element mounting area 150 being a starting point, the sets arranged successively in the longitudinal direction of substrate 101. In this case, multiple connection parts 115 has a regularity of 4.

Note that connection parts 115$a$, 115$b$, 115$c$, and 115$d$ are given marks different from one another for convenience of description. After all, these connection parts, same as connection part 115, are part of copper foil layer 110 formed on base member 109, on which resist layer 120 is formed.

In this way, a low regularity in the orientation of multiple connection parts 115 with each element mounting area 150 being a reference point provides higher light distribution characteristics.

The reason is described below. Resist layer 120 is present above connection parts 115, which are part of copper foil layer 110. In other words, the part of connection part 115 in a top view is part of second area 122. The part of connection parts 115 is resist layer 120 thinner than first area 121. Accordingly, resist layer 120 positioned above each of multiple connection parts 115 has a lower light reflectance than first area 121 positioned near resist layer 120. Consequently, the part where connection parts 115 are provided can be viewed as a darker part (i.e., lower brightness) than surrounding first area 121. A higher regularity causes a dark part to appear at the same position of first area 121; lower, a different position. A dark part at the same position on the substrate is noticeable and thus is preferable. This dark part makes the light distribution characteristics uneven and thus is unpreferable.

To improve this disadvantage, the regularity in the orientation of respective connection parts 115 is lowered in substrate 101. This allows dotted dark parts to be seemingly less noticeable in light-emitting device 200 (refer to FIG. 5) using substrate 101 for instance. Resultingly, a light-emitting device using substrate 101 provides light distribution characteristics with high evenness.

Note that each pattern of the position or posture of multiple connection parts 115 (i.e., 115$a$ through 115$d$) is an example pattern that makes less noticeable dark parts that can discretely appear on substrate 100 (or 101).

Consequently, for light-emitting device 200 to achieve less noticeable dark parts and light distribution characteristics with high evenness, the substrate is preferably structured as follows.

The substrate has multiple element mounting areas 150 linearly arranged and includes multiple first areas 121 and multiple connection parts 115 each corresponding to multiple element mounting areas 150. One of multiple connection parts 115 preferably extends in a direction different from others in a top view.

MODIFIED EXAMPLE 2 OF SUBSTRATE 100

Figure 7:
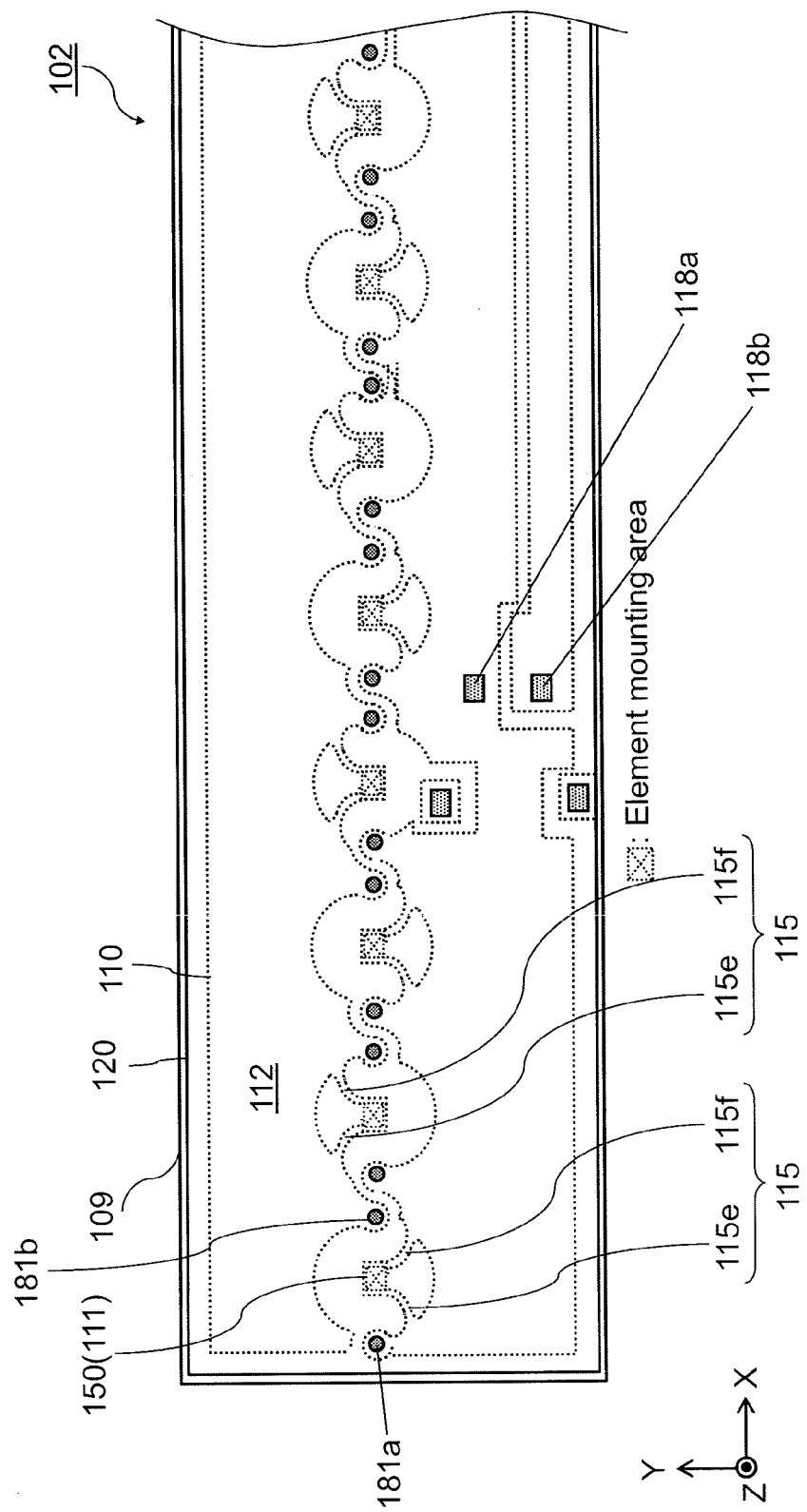
FIG. 7 is a top view illustrating the structural overview of the substrate according to modified example 2 of the substrate in FIG. 1.

FIG. 7 is a top view illustrating the structural overview of substrate 102 according to modified example 2 of substrate 100.

Connection part 115 of substrate 102 shown in FIG. 7 is separated into two parts.

Concretely, substrate 102 includes first connection part 115$e$ and second connection part 115$f$ of connection part 115, each connecting each of the two parts: the part (first part 111) positioned below element mounting area 150 and the part (second part 112) positioned outside first area 121 in a top view.

As shown in FIG. 7, in substrate 102, each of multiple connection parts 115 is formed on base member 109 so that the positions and postures are different from one another with each element mounting area 150 for adjacent two connection parts 115 being a starting point in a top view.

In this way, with one element mounting area 150 branching into two connection parts (first connection part 115e, second connection part 115f), heat generated by LED 30 can be separately conducted to second part 112, thereby increasing the heat discharge characteristics of substrate 102.

In other words, to achieve high heat discharge characteristics, connection part 115 extending from element mounting area 150 of the substrate is preferably one of the multiple connection parts extending from element mounting area 150 in directions different from one another in a top view.

MODIFIED EXAMPLE 3 OF SUBSTRATE 100

Figure 8:
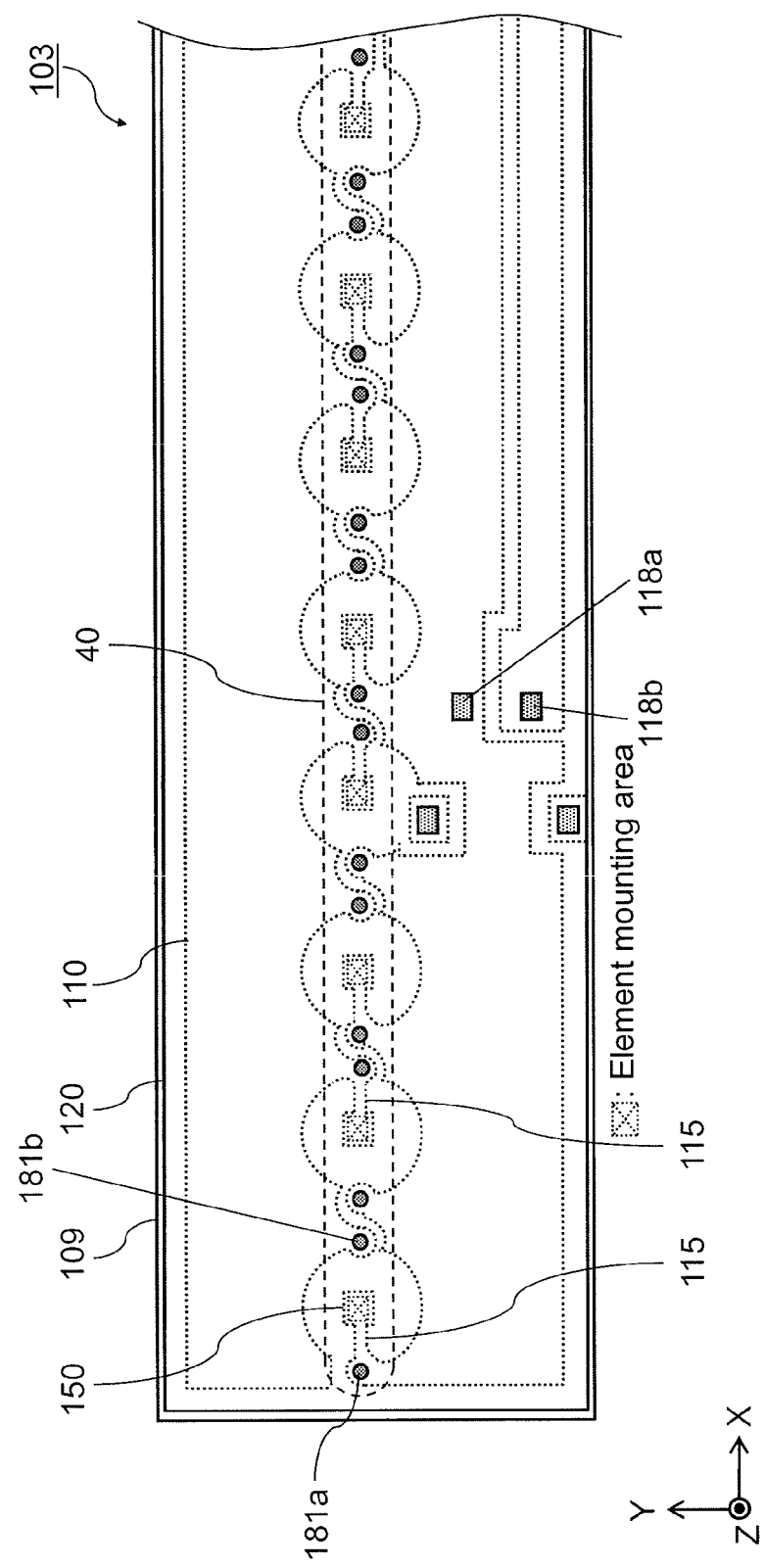
FIG. 8 is a top view illustrating the structural overview of the substrate according to modified example 3 of the substrate in FIG. 1.

FIG. 8 is a top view illustrating the structural overview of substrate 103 according to modified example 3 of substrate 100.

In substrate 103 in FIG. 8, multiple connection parts 115 are arranged in parallel with multiple element mounting areas 150.

This arrangement causes the upper part of multiple connection parts 115 to be covered with sealing material 40 formed in the arrangement direction of multiple element mounting areas 150 for instance.

Sealing material 40 contains light wavelength converters (e.g., yellow fluorescent particles) that cause light diffusion inside sealing material 40. Accordingly, when the upper part of multiple connection part 115 is covered with sealing material 40, sealing material 40 makes less noticeable dark parts that are discretely produced on substrate 103, resulting from the presence of multiple connection parts 115.

As shown in FIG. 8, the arrangement of multiple element mounting areas 150 in the direction same as that of connection parts 115 in a top view allows the upper part of all connection parts 115 to be covered with sealing material 40, even if sealing material 40 is relatively thin.

Note that even the following example gives the above advantage. That is, as in substrate 100 shown in FIG. 1, the respective orientations of multiple connection parts 115 are diagonal to the arrangement orientation of multiple element mounting areas 150 in a top view. In other words, in substrate 100 shown in FIG. 1, sealing material 40 has only to be formed so as to cover the upper part of all connection parts 115.

MODIFIED EXAMPLE 4 OF SUBSTRATE 100

Figure 9:
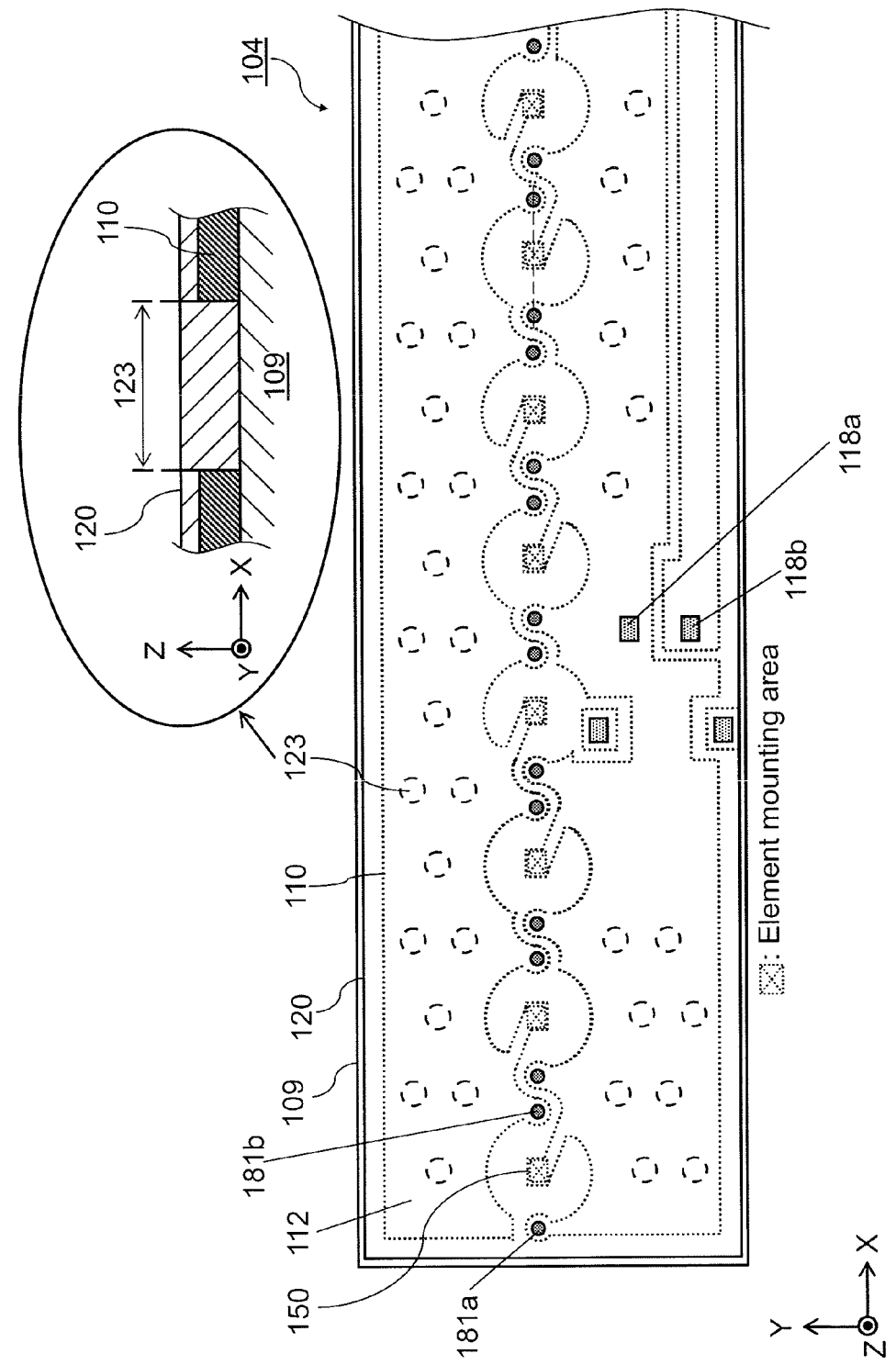
FIG. 9 is a top view illustrating the structural overview of the substrate according to modified example 4 of the substrate in FIG. 1.

FIG. 9 is a top view illustrating the structural overview of substrate 104 according to modified example 4 of substrate 100.

Substrate 104 shown in FIG. 9 is surrounded by second area 122 where copper foil layer 110 is provided in a top view and has third area 123 where copper foil layer 110 is not provided. Resist layer 120 is thicker in third area 123 than in second area 122.

In other words, substrate 104 has a blank area (third area 123) of copper foil layer 110 at a position relatively remote from element mounting area 150, besides a blank area (first area 121) of copper foil layer 110 provided so as to surround element mounting area 150. In more detail, as shown in FIG. 9, substrate 104 has dotted blank areas of copper foil layer 110 in an area outside first area 121 (i.e., an area surrounded by second area 122) in a top view.

After all, third area 123 in resist layer 120 is as thick as in first area 121 (refer to FIG. 3), which is relatively thick. This results in the presence of third area 123 having a relatively high reflectivity of light outside first area 121 in resist layer 120.

Light-emitting device 200 (refer to FIG. 5) including substrate 104, when used for an illuminating light source (e.g., a straight-tube LED lamp), has higher light distribution characteristics owing to third area 123.

Concretely, in illuminating light source 500 (described later) shown in FIG. 13, part of light emitted from LED 30 of light-emitting device 200 is reflected on the inner surface of a transparent outer shell (e.g., a glass tube of a straight-tube LED lamp) in the inside of which light-emitting device 200 is placed. This reflected light reflects in third area 123, transmits through outer shell 510, and is radiated outside.

After all, in illuminating light source 500 having substrate 104, third area 123 functions as an element that efficiently extracts reflected light (scattering light) on the inner surface of the outer shell to the outside of the outer shell.

In this way, a light-emitting device including substrate 104 achieves higher light distribution characteristics owing to illuminating light source 500 placed at an inward part of the transparent outer shell.

MODIFIED EXAMPLE 5 OF SUBSTRATE 100

Figure 10:
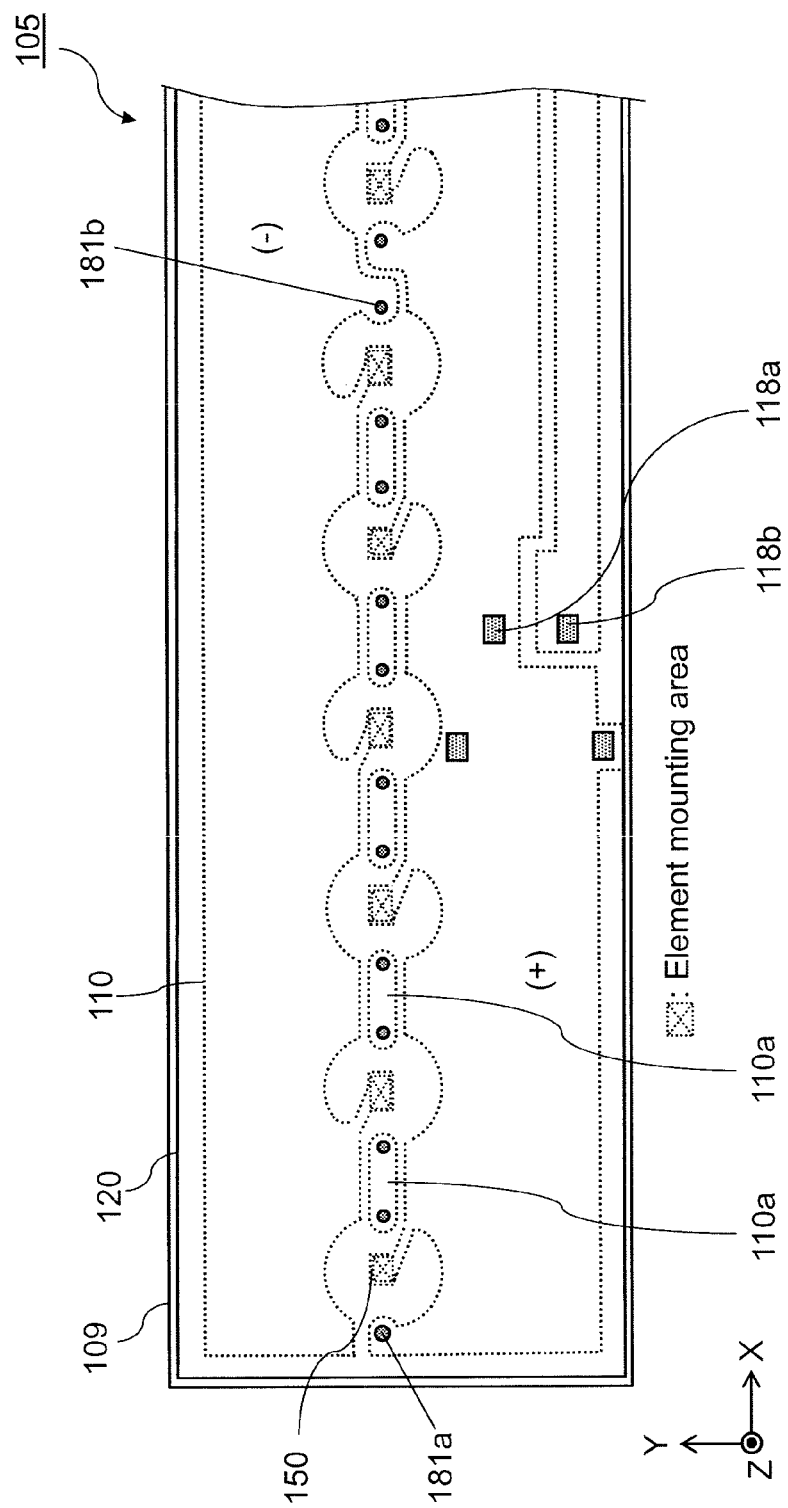
FIG. 10 is a top view illustrating the structural overview of the substrate according to modified example 5 of the substrate in FIG. 1.

FIG. 10 is a top view illustrating the structural overview of substrate 105 according to modified example 5 of substrate 100.

In substrate 105 shown in FIG. 10, the pattern of copper foil layer 110 is formed so as to connect multiple LEDs 30 in series.

Concretely, substrate 105 has joint 110a electrically separated from copper foil layer 110 in second area 122 placed between adjacent element mounting areas 150 in a top view.

In the example shown in FIG. 10, a total of five joints 110a are formed between each pair of element mounting areas 150 positioned from the first through the sixth (from the leftmost). When substrate 105 has LEDs 30 mounted in respective multiple element mounting areas 150, LEDs 30 from the leftmost through the sixth are connected in series.

Concretely, joint 110a connects gold wire 35 connected to the p-side electrode of one of two LEDs 30 provided with joint 110a interposed therebetween to gold wire 35 connected to the n-side electrode of the other LED 30. Consequently, six LEDs 30 are connected in series.

Note that LEDs 30 from the seventh (from the leftmost) and after in FIG. 10 are connected in series by a unit of six in the same way. Some groups of LEDs 30 each composed of six series-connected LEDs 30 are connected in parallel.

In this way, even in a case where the connection forms of multiple LEDs 30 mounted on substrate 105 include series connection, first area 121 can be provided so as to surround element mounting area 150 as shown in FIG. 10.

After all, in the same way as substrate 100, substrate 105 has an area with a high light reflectance around LEDs 30 mounted. This enhances the light extraction efficiency of light-emitting device 200 using substrate 105.

Note that the number of LEDs 30 connected in series is not limited to 6. Further, although the connection forms of multiple LEDs 30 mounted on substrate 105 include parallel connection, all LEDs 30 mounted on substrate 105 may be connected in series.

[Lighting Apparatus]

Figure 11:
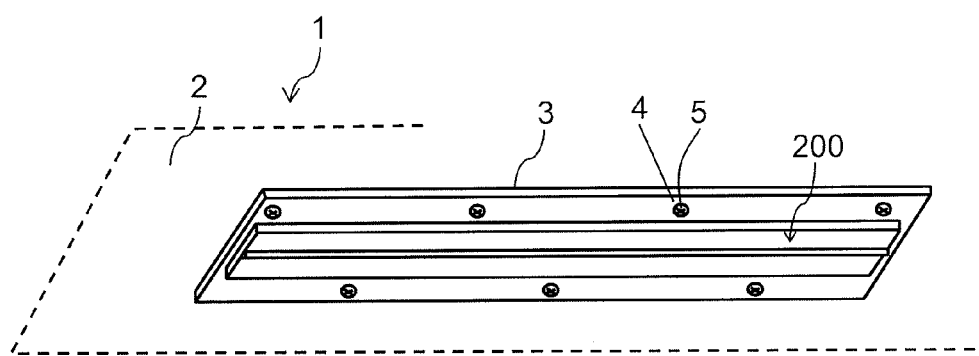
FIG. 11 is an appearance perspective view of a lighting apparatus according to the embodiment.

Next, a description is made of a lighting apparatus of the embodiment in reference to FIG. 11.

FIG. 11 is an appearance perspective view of lighting apparatus 1 according to the embodiment. Lighting apparatus 1 is an example where light-emitting device 200 is applied.

As shown in FIG. 11, lighting apparatus 1 is of a base-light type, and includes light-emitting device 200 and lighting appliance 2 for supplying power for light emission to light-emitting device 200.

Lighting apparatus 1 further includes attaching component 3 for attaching light-emitting device 200 to lighting appliance 2. Light-emitting device 200 together with attaching component 3 is directly connected to lighting appliance 2.

Lighting appliance 2 incorporates a lighting control circuit for controlling lighting of light-emitting device 200, and other parts. Lighting appliance 2 is provided with a screw hole (not shown) so as to match through hole 4 of attaching component 3. Thus, through hole 4 of attaching component 3 agrees with the screw hole (not shown) of lighting appliance 2 in position.

Lighting appliance 2 can be formed by press working on an aluminum steel plate for instance. Lighting appliance 2 is directly connected to a ceiling for instance.

Attaching component 3 is a ruler-like substrate such as a ruler-like metal base substrate made of aluminum for instance. Attaching component 3 is provided with multiple through holes 4. To fix attaching component 3 to lighting appliance 2, match through hole 4 of attaching component 3 with the screw hole (not shown) of lighting appliance 2; insert screw 5 into through hole 4; and then screw-fit screw 5 with through hole 4 and the screw hole (not shown).

Lighting appliance 2 is provided with through holes 4 in the opposing long sides of attaching component 3 in two rows in a staggered configuration. For example, as shown in FIG. 11, four through holes are provided in one long side of attaching component 3, and three through holes are provided in the other long side so as not to face the four. The way of fixing attaching component 3 to light-emitting device 200 is not especially limited. They are fixed to each other with an adhesive for instance.

Note that lighting apparatus 1 does not need to have attaching component 3. For example, light-emitting device 200 may be directly mounted on lighting appliance 2.

Figure 12A:
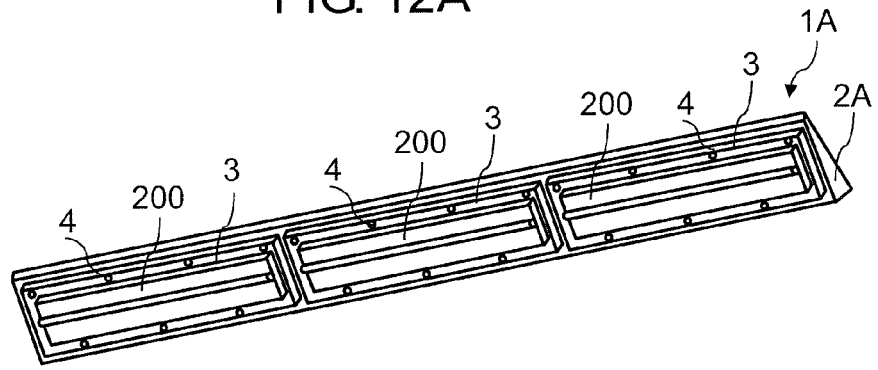
FIG. 12A shows a first concrete example of another lighting apparatus according to the embodiment.
Figure 12B:
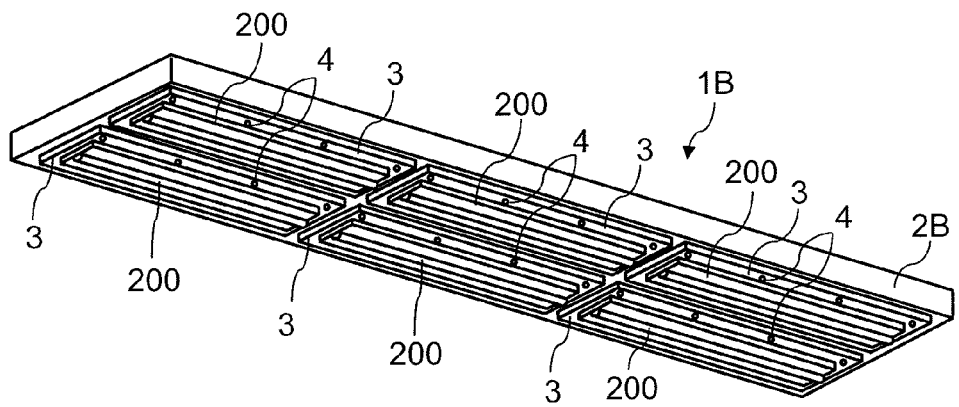
FIG. 12B shows a second concrete example of another lighting apparatus according to the embodiment.
Figure 12C:
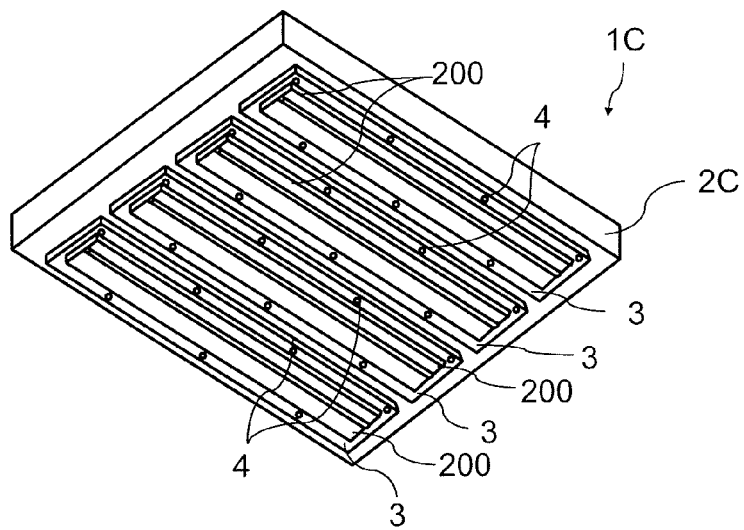
FIG. 12C shows a third concrete example of another lighting apparatus according to the embodiment.

Here, a description is made of a concrete example of another lighting apparatus according to the embodiment in reference to FIGS. 12A through 12C, which illustrate first through third concrete examples of the lighting apparatus.

Lighting apparatus 1A shown in FIG. 12A is a modified type of protruding lighting appliance 2A, where each of the two inclined surfaces has three light-emitting devices 200 attached thereon. Lighting apparatus 1B shown in FIG. 12B is a modified type of rectangle lighting appliance 2B, where its one surface has six light-emitting devices 200 attached thereon. Lighting apparatus 1C shown in FIG. 12C is a modified type of square lighting appliance 2C, where it has four light-emitting devices 200 attached thereon.

Note that the number of light-emitting devices 200 attached to lighting appliance 2A to 2C in lighting apparatus 1A to 1C is an example and not limited. Further, to attach light-emitting device 200, above-described attaching component 3 as shown in each figure is used for instance.

Note that lighting apparatus 1A to 1C may be provided with a transparent cover (not shown) so as to cover light-emitting device 200.

One light-emitting device 200 uses one attaching component 3, but not limited. For example, multiple light-emitting devices 200 may be fixed to one attaching component 3.

In each of lighting apparatus 1A through 1C, through holes 4 of attaching component 3 are provided in both long sides of the substrate, but may be provided only in one long side.

In each of lighting apparatus 1A through 1C, screw holes are formed by providing through holes 4 in attaching component 3, but the structure for inserting screw 5 may be a cutout (not a through hole). For example, a semicircular cutout provided in a long side of attaching component 3 allows screw clamping.

Attaching component 3 may use a component conforming to a given standard.

[Illuminating Light Source]

Figure 13:
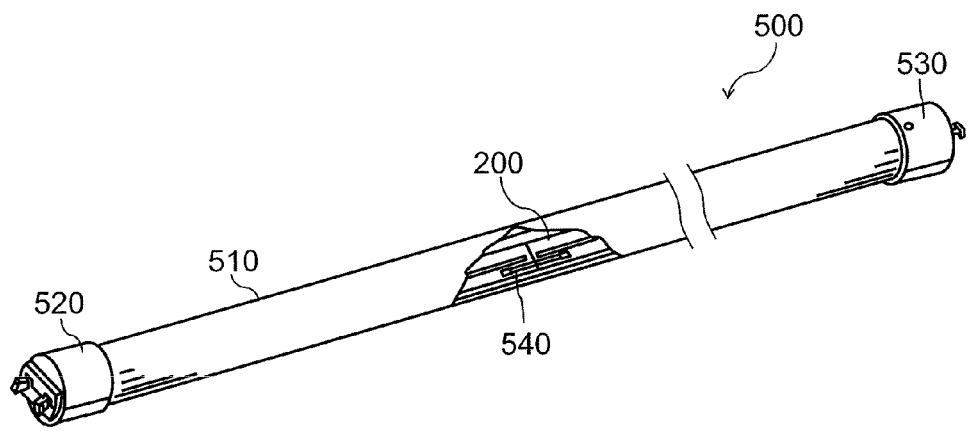
FIG. 13 is a perspective view of yet another illuminating light source according to the embodiment.

Next, a description is made of an illuminating light source according to the embodiment of the disclosure in reference to FIG. 13.

FIG. 13 is a perspective view of illuminating light source 500 according to the embodiment.

Illuminating light source 500 is an example where light-emitting device 200 is applied.

Illuminating light source 500 is a straight-tube LED lamp as a substitute for a straight-tube fluorescent lamp, which is same as a straight-tube fluorescent lamp with an overall length of 4 feet for instance.

As shown in FIG. 13, illuminating light source 500 includes light-emitting device 200; and transparent outer shell 510 with light-emitting device 200 placed at an inward part thereof.

Illuminating light source 500 includes multiple light-emitting devices 200 inside outer shell 510; and a pair of bases 520 and 530 on both ends of outer shell 510. Outer shell 510 is a ruler-like, tubular component made of glass or resin.

Multiple light-emitting devices 200 are electrically connected together with connector wire 540 for instance. Outer shell 510 may include a lighting control circuit for making light-emitting device 200 emit light and a heat sink (metal base) for placing light-emitting device 200 thereon (both not shown).

[Lighting Apparatus]

Figure 14:
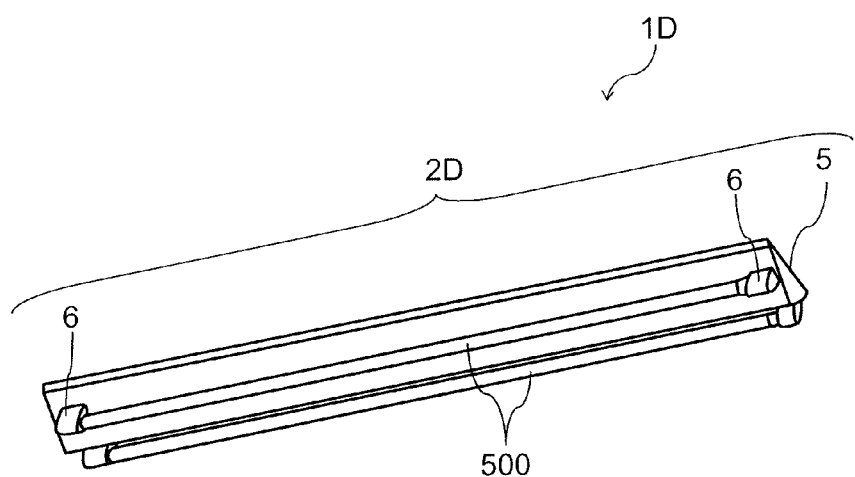
FIG. 14 is a perspective view of yet another lighting apparatus according to the embodiment.

Next, a description is made of still another lighting apparatus according to the embodiment of the disclosure using FIG. 14.

FIG. 14 is a perspective view of lighting apparatus 1D according to the embodiment.

As shown in FIG. 14, lighting apparatus 1D is a base-light lighting apparatus including an illuminating light source. Lighting apparatus 1D includes illuminating light source 500; and lighting appliance 2D for supplying power for light emission to illuminating light source 500 for instance.

Lighting appliance 2D includes main unit 6; and a pair of sockets 7 attached to main unit 6. The pair of sockets 7 electrically connects illuminating light source 500 with main unit 6 and holds illuminating light source 500.

Main unit 6 can be formed by press working on an aluminum steel plate for instance. The inner surface of main unit 6 functions as a reflecting surface that reflects light emitted from illuminating light source 500 in a given direction (e.g., downward).

Lighting appliance 2D thus configured is attached onto a ceiling for instance through a bracket. Note that lighting appliance 2D incorporates a power supply circuit for controlling lighting of illuminating light source 500, and other parts. Lighting appliance 2D may be provided with a transparent cover so as to cover illuminating light source 500.

[Others]

Hereinbefore, the description is made of a substrate, a light-emitting device, and others according to the disclosure on the basis of the embodiment and some modified examples, but the scope of the disclosure is not limited to the embodiment or modified examples.

For example, the shape surface of each of substrates 100 through 105 in a top view does not need to be ruler-like as shown in FIG. 1, but it may be various types of shapes such as a polygon (other than a square or rectangle), circle, and a shape composed of straight lines and curved lines.

In substrate 100 to 105, multiple LEDs 30 are linearly arranged, but not limited. For example, they may be arranged in a matrix, or in a circle or ellipse.

First area 121 where resist layer 120 is formed is formed so as to surround element mounting area 150 in a top view (refer to FIG. 2 for instance).

However, the shape of first area 121 is not especially limited, but it may be a polygon as a whole in a top view.

A substrate such as substrate 100 has only to be provided with at least one element mounting area 150. In other words, a substrate such as substrate 100 has only to be provided with at least one of each of first area 121 and connection part 115 for instance (refer to FIGS. 2A and B) correspondingly to element mounting area 150.

Copper foil layer 110 formed on a substrate such as substrate 100 does not need to have connection part 115. In other words, first part 111 (refer to FIG. 2B), which is a part of copper foil layer 110 directly below LED 30, may be separated from second part 112, which is a part corresponding to the outside of first area 121.

Even in this case, first part 111 functions as a component that conducts heat to base member 109 in contact with first part 111 for instance.

Element mounting area 150 positioned directly above first part 111, even if physically separated from the other part of second area 122, composes part of second area 122. In other words, even if copper foil layer 110 does not include connection part 115, element mounting area 150 is included in second area 122.

In the above embodiment and modified examples, the description is made of the examples where light-emitting device 200 is used for an illuminating light source and lighting apparatus, but not limited.

Light-emitting device 200 according to the above embodiment and modified examples can be used for a light sources of a copier, guide light, signboard, and other electronic devices, as well as for industrial use (e.g., an inspection line).

In light-emitting device 200, sealing material 40 containing light wavelength converters is not an essential component. For example, when light-emitting device 200 is used for illumination directly taking advantage of the emission color of LED 30, light-emitting device 200 does not need to contain light wavelength converters.

Although the example is illustrated where light-emitting device 200 is applied to a straight-tube LED lamp, light-emitting device 200 is also applicable to a bulb-type LED lamp and a round-tube lamp.

In the above embodiment and modified examples, light-emitting device 200 is configured to emit white light by means of a blue color LED chip and a fluorescent substance, but not limited. For example, white light may be emitted using a resin containing fluorescent substances (red and green) in combination with a blue color LED chip, where an LED chip that emits light other than blue one may be used.

In the above embodiment and modified examples, light-emitting device 200 uses an LED as a semiconductor light-emitting element; other types of semiconductor light-emitting elements may be used such as semiconductor laser, organic electroluminescence (EL), and inorganic EL.

Note that the scope of the disclosure includes any embodiments achieved from various types of modifications that could be devised from each embodiment and each modified example by those skilled in the art; and any embodiments achieved by combining any components and any functions in each embodiment and each modified example within a scope that does not deviate from the gist of the disclosure.

What is claimed is:

1. A light-emitting device comprising:
   a substrate; and
   a semiconductor light-emitting element mounted on the substrate,
   wherein the substrate includes:
   a plate-like base member;
   a copper foil layer on part of the base member;
   a first area that extends around and is positioned outside an element mounting area, in which the semiconductor light-emitting element is mounted in a top view, and that does not include the copper foil layer;
   a second area including an area extending around and positioned outside the first area in a top view, and an area in the element mounting area in the top view, the copper foil layer being provided in the second area; and
   a white resist layer covering the first area and the second area, a thickness of the white resist layer on the first area being thicker than a thickness of the white resist layer on the second area,
   wherein the semiconductor light-emitting element is positioned on the white resist layer.

2. The light-emitting device of claim 1, wherein the copper foil layer in the second area includes a connection part that connects the area positioned in the element mounting area in the top view with the area positioned outside the first area in the top view.

3. The light-emitting device of claim 2,
   wherein the semiconductor light-emitting element is one of a plurality of semiconductor light-emitting elements,
   wherein the element mounting area is one of a plurality of element mounting areas,
   wherein the first area is one of a plurality of first areas,
   wherein the connection part is one of a plurality of connection parts,
   wherein the substrate includes the plurality of semiconductor light-emitting elements mounted on the substrate in a linear arrangement in each of the plurality of element mounting areas in a linear arrangement,
   wherein the light-emitting device includes the plurality of the first areas and the plurality of connection parts, and each of both the first area and connection part are provided to correspond to each of the plurality of element mounting areas, and
   wherein, in the top view, each of the plurality of connection parts extends in a direction nonorthogonal to a direction in which the plurality of element mounting areas are arranged.

4. The light-emitting device of claim 2,
   wherein the semiconductor light-emitting element is one of a plurality of semiconductor light-emitting elements,
   wherein the element mounting area is one of a plurality of element mounting areas,
   wherein the first area is one of a plurality of first areas,
   wherein the connection part is one of a plurality of connection parts, wherein the substrate includes the plurality of semiconductor light-emitting elements mounted on the substrate in a linear arrangement in each of the plurality of element mounting areas in a linear arrangement, wherein the light-emitting device includes the plurality of the first areas and the plurality of connection parts, and each of both the first area and connection part are provided to correspond to each of the plurality of element mounting areas, and wherein, in the top view, one of the plurality of connection parts extends in a direction different from a direction in which the other of the plurality of connection parts extends.

5. The light-emitting device of claim 2, wherein, in the top view, the connection part is one of a plurality of connection parts extending from the element mounting area in directions different from one another.

6. The light-emitting device of claim 2,
wherein the semiconductor light-emitting element is one of a plurality of semiconductor light-emitting elements,
wherein the element mounting area is one of a plurality of element mounting areas,
wherein the first area is one of a plurality of first areas,
wherein the connection part is one of a plurality of connection parts,
wherein the substrate includes the plurality of semiconductor light-emitting elements mounted on the substrate in a linear arrangement in each of the plurality of element mounting areas in a linear arrangement,
wherein the light-emitting device includes the plurality of first areas and the plurality of connection parts, and each of both the first area and connection part are provided to correspond to each of the plurality of element mounting areas, and
wherein the light-emitting device further includes a linear sealing material that collectively seals the plurality of semiconductor light-emitting elements and the plurality of connection parts.

7. The light-emitting device of claim 2,
wherein the element mounting area is one of a plurality of element mounting areas,
wherein the connection part is one of a plurality of connection parts, and
wherein, in the top view, the plurality of connection parts extend in a direction parallel to a direction in which the plurality of element mounting areas are arranged.

8. The light-emitting device of claim 2,
wherein the element mounting area is one of a plurality of element mounting areas, and
wherein the light-emitting device further includes a joint electrically separated from the copper foil layer in the second area and disposed between at least one set of two adjacent element mounting areas among the plurality of element mounting areas.

9. The light-emitting device of claim 1, further comprising a third area that is surrounded by the second area in the top view and does not include the copper foil layer,
wherein the white resist layer is thicker on the third area than on the second area.

10. An illuminating light source comprising:
the light-emitting device of claim 1; and
a transparent outer shell with the light-emitting device disposed at an inward part of the transparent outer shell.

11. A lighting apparatus comprising:
the light-emitting device of claim 1; and
a lighting appliance that has the light-emitting device mounted thereon and supplies power for light emission to the light-emitting device.

12. The light-emitting device of claim 2, wherein the first area extends around the element mounting area except for the connection part, and the second area extends around the first area except for an area connecting the first area with the first area of an adjacent element mounting area.

* * * * *